United States Patent
Cai et al.

(10) Patent No.: US 10,854,239 B1
(45) Date of Patent: Dec. 1, 2020

(54) ADAPTIVE-RATE ERROR CORRECTION LAYER FOR TAPE STORAGE

(71) Applicant: Facebook, Inc., Menlo Park, CA (US)

(72) Inventors: Yu Cai, Palo Alto, CA (US); Wlodzimierz Stanley Czarnecki, Palo Alto, CA (US); John Mah, Westminster, CO (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 16/528,442

(22) Filed: Jul. 31, 2019

(51) Int. Cl.
*G11B 20/18* (2006.01)
*G11B 5/008* (2006.01)
*H03M 13/35* (2006.01)

(52) U.S. Cl.
CPC ...... *G11B 20/1833* (2013.01); *G11B 5/00813* (2013.01); *H03M 13/353* (2013.01)

(58) Field of Classification Search
CPC ........... G11B 20/1833; G11B 5/00813; H03M 13/353
See application file for complete search history.

(56) References Cited

U.S. PATENT DOCUMENTS

| | | | | |
|---|---|---|---|---|
| 5,406,425 A * | 4/1995 | Johnston | ............... | G06F 3/0601 360/48 |
| 5,847,892 A * | 12/1998 | Goker | .................... | G11B 5/588 360/76 |
| 6,130,792 A * | 10/2000 | Goker | .................... | G11B 5/588 360/48 |
| 6,282,039 B1 * | 8/2001 | Bartlett | .................. | G11B 20/12 360/47 |
| 6,282,040 B1 * | 8/2001 | Bartlett | ................. | G06F 3/0614 360/31 |
| 9,431,054 B1 * | 8/2016 | Goker | ................. | G06F 11/1076 |
| 2001/0037484 A1 * | 11/2001 | Paterson | ............ | G11B 20/1833 714/784 |
| 2014/0136918 A1 * | 5/2014 | Katagiri | ............ | H03M 13/2909 714/755 |
| 2014/0136919 A1 * | 5/2014 | Katagiri | ............ | G11B 20/1833 714/755 |
| 2015/0193303 A1 * | 7/2015 | Katagiri | ............ | G11B 20/1833 714/764 |
| 2016/0117133 A1 * | 4/2016 | Blaum | .................. | G06F 3/0644 711/114 |
| 2019/0189156 A1 * | 6/2019 | Butt | .................... | G11B 5/00813 |
| 2019/0189157 A1 * | 6/2019 | Cideciyan | .......... | G11B 20/1886 |
| 2019/0361606 A1 * | 11/2019 | Goker | ................. | G06F 11/1612 |

(Continued)

*Primary Examiner* — Kyle Vallecillo
(74) *Attorney, Agent, or Firm* — Van Pelt, Yi & James LLP

(57) ABSTRACT

Data set groups are determined, wherein each data set group includes a plurality of data sets and each data set includes error-correcting information for content user data of the data set. One or more versions of data set group level error-correcting information for each data set group are calculated. The data set groups on stored a tape storage media. After the data set groups are stored, an amount of storage available on one or more regions of the tape storage media associated with one or more tape edges is identified. An instruction is provided to store at least a partial amount of the calculated one or more versions of data set group level error-correcting information for the data set groups able to be stored in the amount of storage available on the one or more regions of the tape storage media associated with the one or more tape edges.

20 Claims, 11 Drawing Sheets

(56) References Cited

U.S. PATENT DOCUMENTS

2020/0125272 A1* 4/2020 Greco .................... G06F 3/0634
2020/0125277 A1* 4/2020 Greco .................... G06F 3/0685
2020/0125289 A1* 4/2020 Greco .................... G06F 3/0655

* cited by examiner

US 10,854,239 B1

ADAPTIVE-RATE ERROR CORRECTION LAYER FOR TAPE STORAGE

BACKGROUND OF THE INVENTION

Because tape libraries are often utilized as the last tier of data backup, it is important that data is reliably stored in tape storage media. Error correction codes can be used to correct data errors in tape storage media. However, if the raw bit error rate or its signal to noise ratio is too high, errors may not be correctable using existing error correction codes. Data also may be duplicated over multiple different tape storage media, but recovery time is greatly increased if recovery requires access to a different tape storage media.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
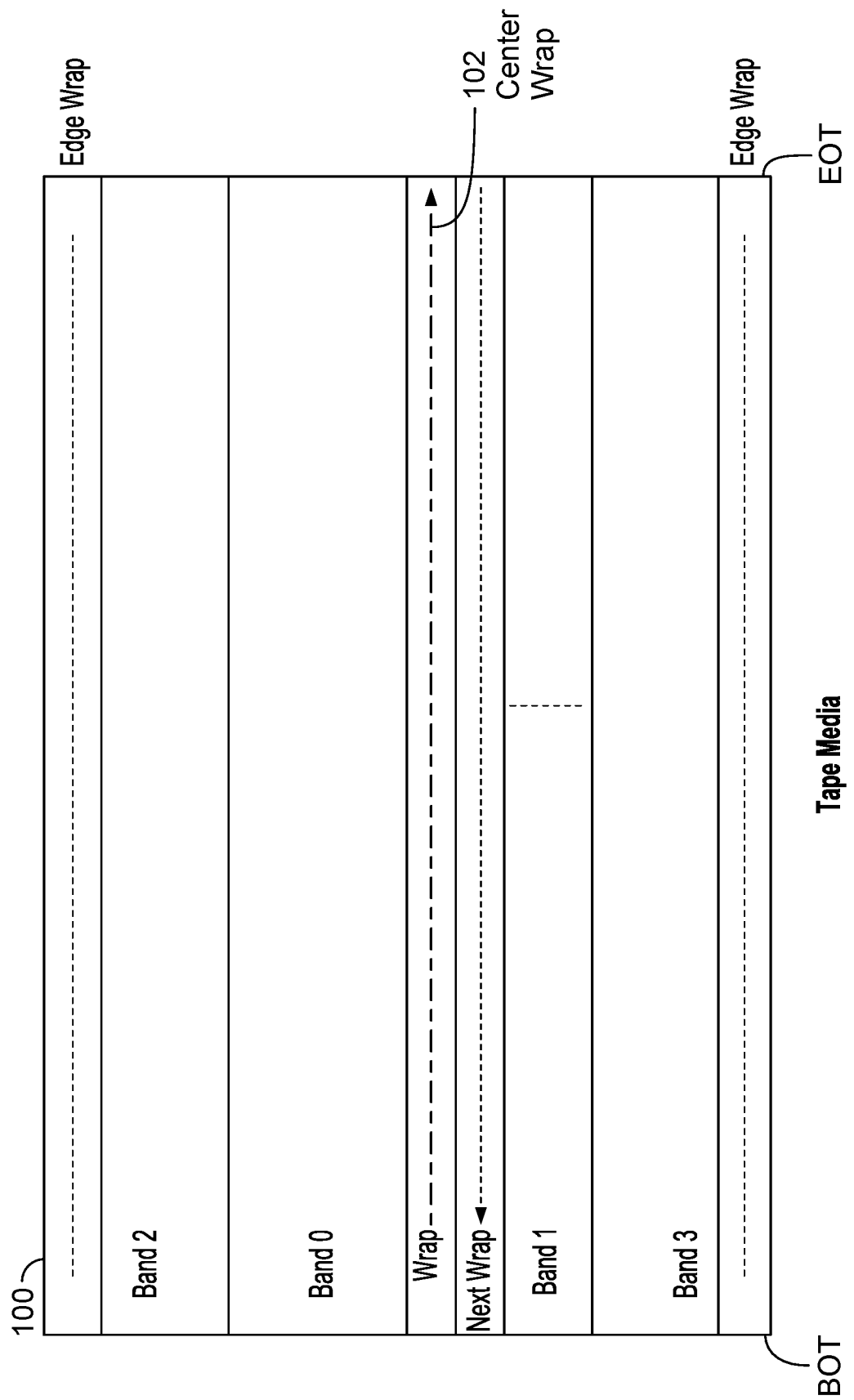
FIG. 1 illustrates an example layout of a tape media 100 that includes a plurality of bands with a plurality of wraps in each band.

FIG. 1 illustrates an example layout of a tape media 100 that includes a plurality of bands with a plurality of wraps in each band. Linear Tape-Open (LTO) is a high-capacity, single-reel tape storage solution. As shown in FIG. 1, a LTO tape media is divided into a plurality of parallel bands. For example, as shown in FIG. 1, the LTO tape media is divided into four parallel data bands, band 0, band 1, band 2, and band 3. In each data band, the LTO format allocates unique locations for the wraps included in the band. For example, each band may include 42 wraps or 168 wraps. During a write operation, the magnetic head is set to follow the location of a wrap in a direction from BOT (beginning of tape) to EOT (end of tape) in order to simultaneously write 32 parallel tracks. Once the head reaches EOT, the actuator sends the magnetic head to the next wrap location to write a set of another 32 parallel data tracks in a reverse direction from EOT to BOT. The process of writing to one wrap from BOT to EOT and then the next wrap from EOT to BOT is repeated until the entire data band is populated with data sets, and a stepper motor may then reposition the head to a new data band for further writing of additional data. Data is first written to the center wrap 102 first, and the wraps closer to the edges of the tape are written to later.

The length of the tape required for writing a certain amount of data depends on the amount of physical defects on the tape. The more physical defects on the tape, the longer the length required for writing the fixed amount of data. The reason is that the tape drive will avoid writing data into a bad portion of a wrap with many defects. When the tape drive encounters a bad region of a wrap, the tape drive write head will not write data to the bad region; instead, it will skip through the bad region and append data in the good regions following the bad region.

Figure 2:
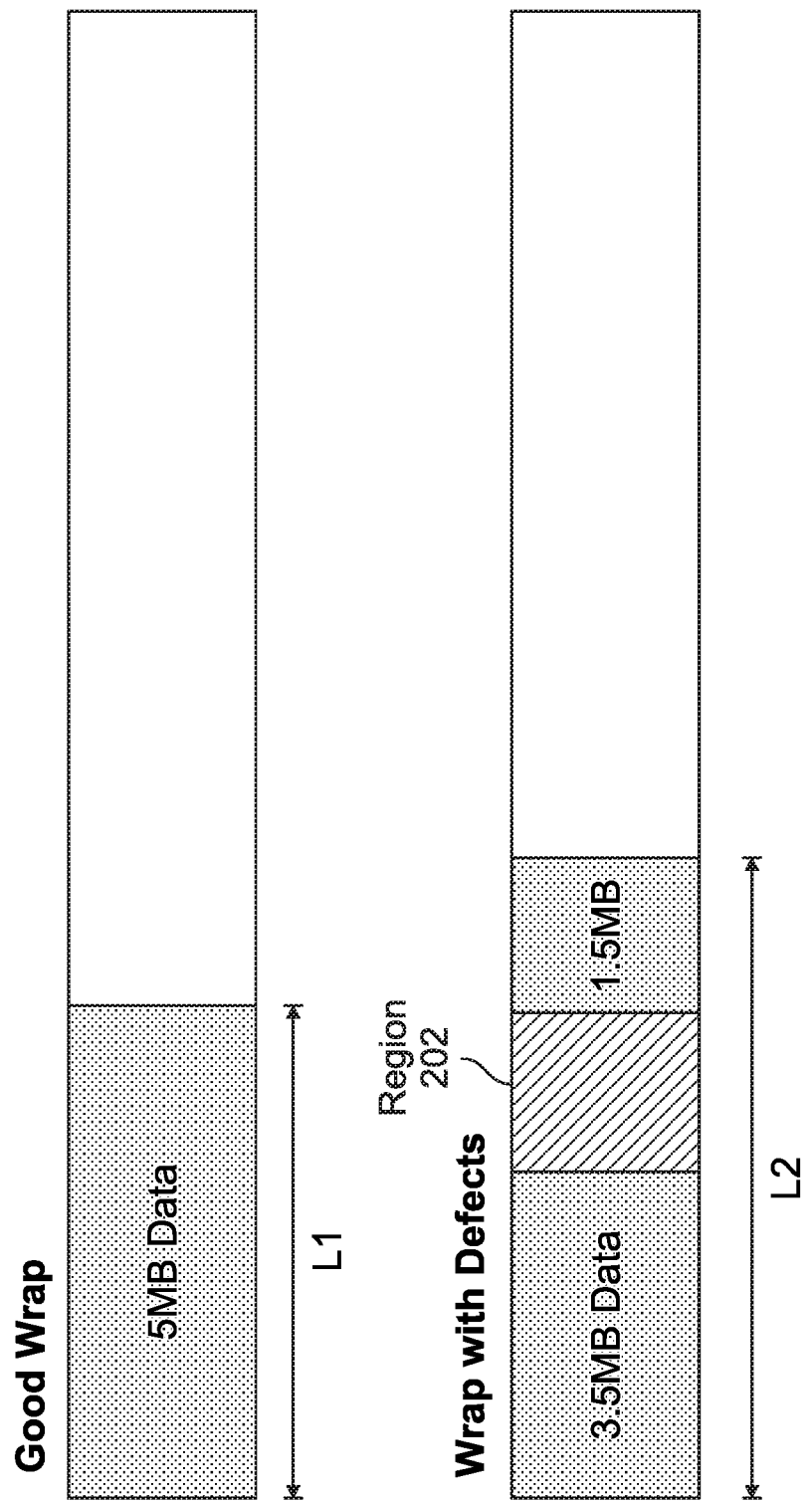
FIG. 2 illustrates that the length of the tape required for writing a certain amount of data depends on the amount of physical defects on the tape.

FIG. 2 illustrates that the length of the tape required for writing a certain amount of data depends on the amount of physical defects on the tape. As shown in FIG. 2, if an x megabytes (e.g., 5 MB) data unit is written to a physical portion of the wrap that has no defects, then the data block will cross L1 meters. However, if the x megabytes of unit data block is written to a physical portion of the wrap with many defects (see the shaded region 202), then the data block will span over L2 meters, where L2 is larger than L1, as some of the bad physical area on the tape will not be written to and be skipped over.

Therefore, if 9 terabytes (9 TB) of data is written to a tape media and if the tape quality is good, then only n wraps (e.g., 164 wraps) are used. However, if the tape quality degrades, then a greater number of wraps, m wraps (e.g. 168 wraps), is needed. To guarantee that a tape media can be written with a fixed amount of data, the tape media with the specification of being able to write 9 TB of data with 164+4=168 wraps can be utilized. If the tape media is good, then 9 TB data can be fit into 164 wraps and 4 additional wraps will be left unused. The 164 wraps are located around the center of the tape and tend to have fewer defects and therefore are more reliable for writing user data. The 4 additional wraps are spare wraps located at the edges of the tape and tend to have more defects and therefore are less reliable for writing data.

Figure 3:
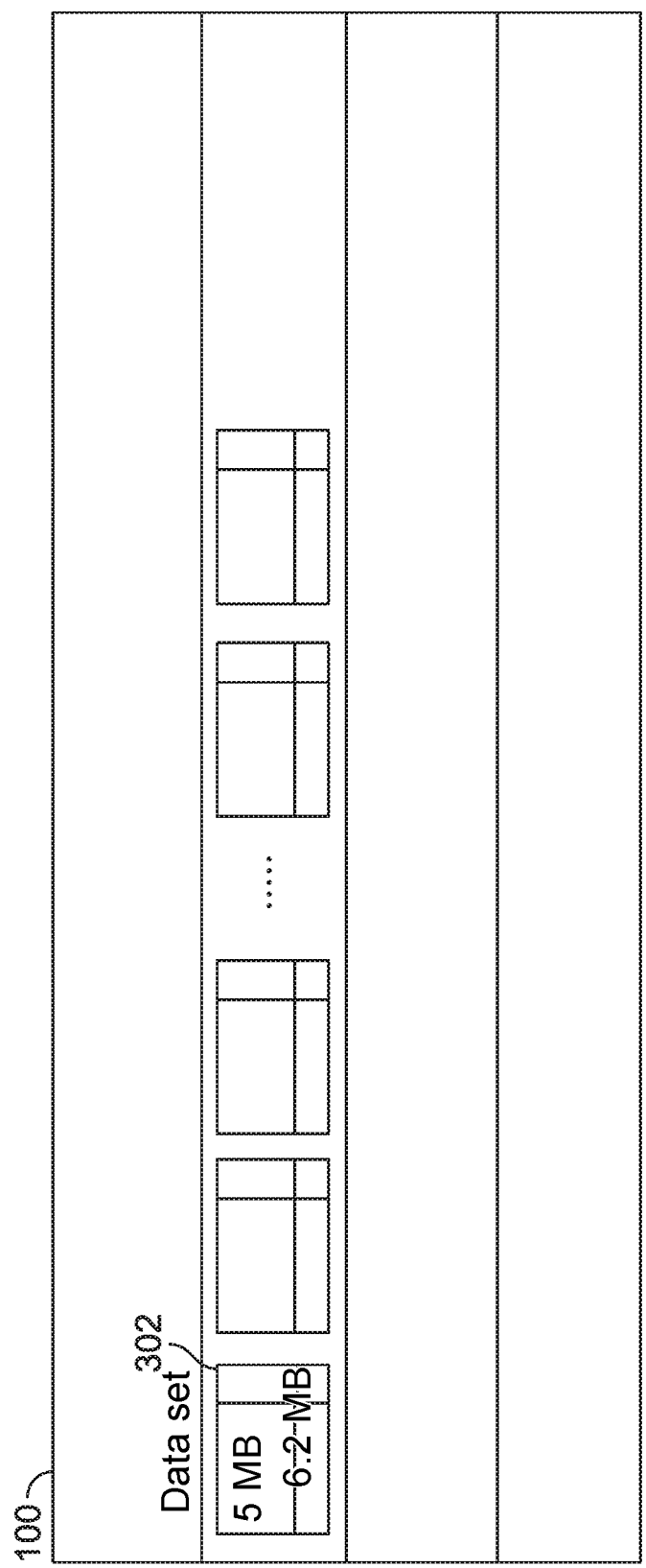
FIG. 3 illustrates one example of a 6.2 MB data set 302 with 5 MB user data and 1.2 MB of C1 and C2 parity data that is stored onto tape media 100.

In some embodiments, the data unit to be stored into a tape media is called a data set (DS). A tape data set has x MB user data as an atomic unit, and the x MB data is protected by a 2D-product code by adding C1 parity bytes (a first layer of error-correcting code (ECC)) and C2 parity bytes (a second layer of ECC) to form a (x+y) MB total data set that is stored onto the tape media. The C1 and C2 parity bytes include data set level error-correcting information that corrects at least some of the errors within a data set. FIG. 3 illustrates one example of a 6.2 MB data set 302 with 5 MB user data and 1.2 MB of C1 and C2 parity data that is stored onto tape media 100. Tape media may have various kinds of errors and the tape drives rely on the 2D-product code to correct the raw errors in each 6.2 MB data set. When a block of data is read from the tape media, if the raw bit error rate is too high or the signal-to-noise ratio in the 6.2 MB data set is too low, errors in the data set may not be recoverable. Thus, the tape drive will re-read the data set and try to recover the errors in the data set for a plurality of times. For example, the tape drive may try up to 50 times to re-read and correct the data set. If the 6.2 MB data set cannot be recovered after such 50 retries, then the tape drive may report a permanent (PERM) error. After a PERM error, all the following data sets cannot be read. To avoid data loss, another error recovery scheme across different tape libraries may be used to rebuild the data. For example, the error recovery scheme may be a Reed-Solomon RAID (redundant array of independent disks) code such as a (5:7) RS-RAID code. However, error recovery across tape libraries using RAID takes a significant amount of time. Also, if the single tape media failure rate is too high, then the failure rate of multiple tape media in a RAID group (e.g. more than 2 tape media fail in a group) will also be too high, resulting in data loss. In addition, one tape media failure will cause the other tape libraries to rebuild the failed tape media and therefore may render the other tape libraries not being able to respond to other normal operations. In some embodiments, a tape library may have up to 9 frames and include 8000 tape media in the system. Therefore, a new error recovery layer that can correct many data set level failures in a tape media by reading the tape media itself and without triggering the Reed-Solomon RAID error recovery scheme would be desirable.

In some embodiments, data set groups are determined, wherein each data set group includes a plurality of data sets and each data set includes error-correcting information for content user data of the data set. One or more versions of data set group level error-correcting information for each data set group are calculated. An instruction is provided to store the data set groups on a tape storage media. After the data set groups are stored on the tape storage media, an amount of storage available on one or more regions of the tape storage media associated with one or more tape edges is identified. An instruction is provided to store at least a partial amount of the calculated one or more versions of data set group level error-correcting information for the data set groups able to be stored in the amount of storage available on the one or more regions of the tape storage media associated with the one or more tape edges.

Figure 4:
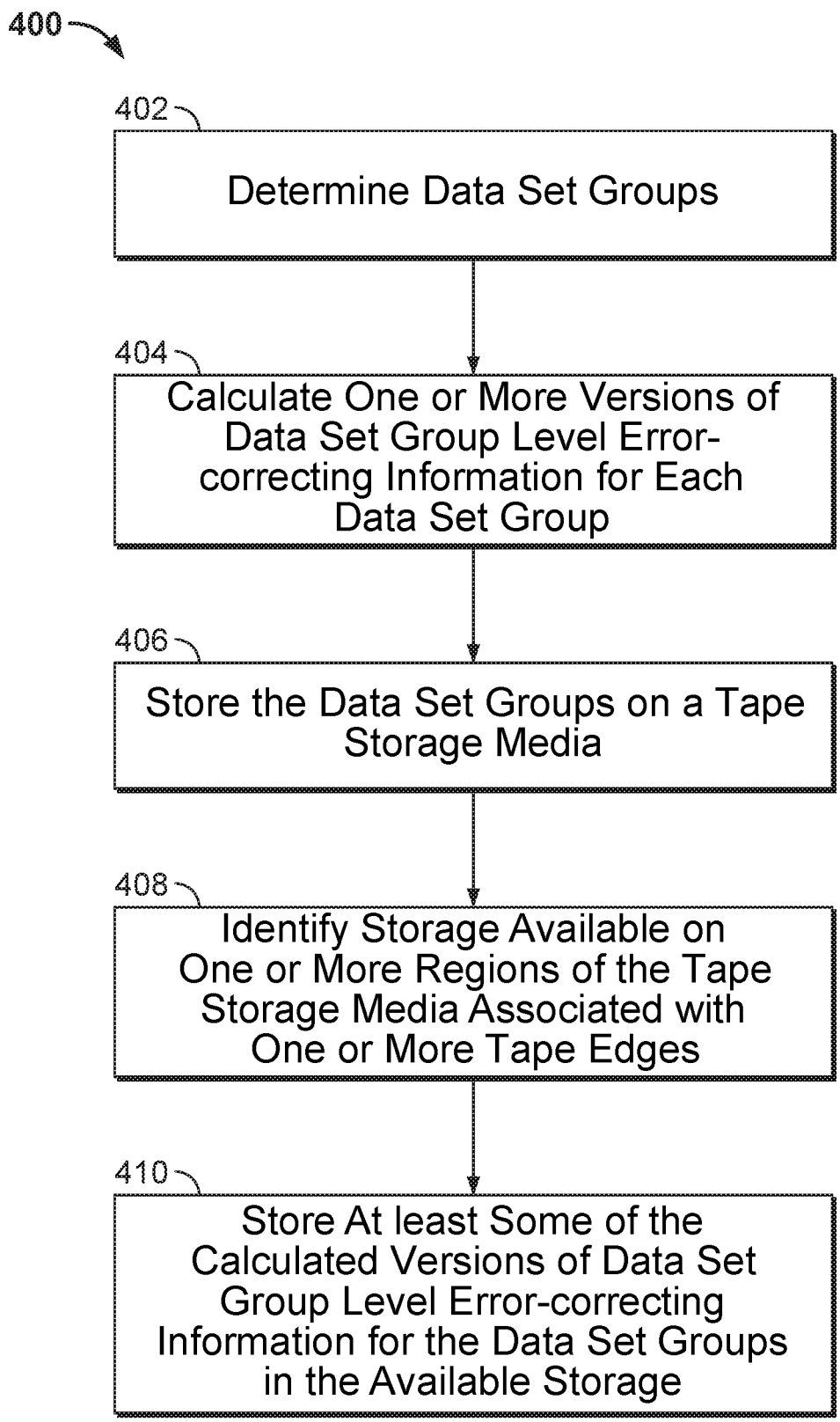
FIG. 4 illustrates an exemplary flow diagram of a process 400 for providing an additional layer of error-correcting code to a tape media.
Figure 5:
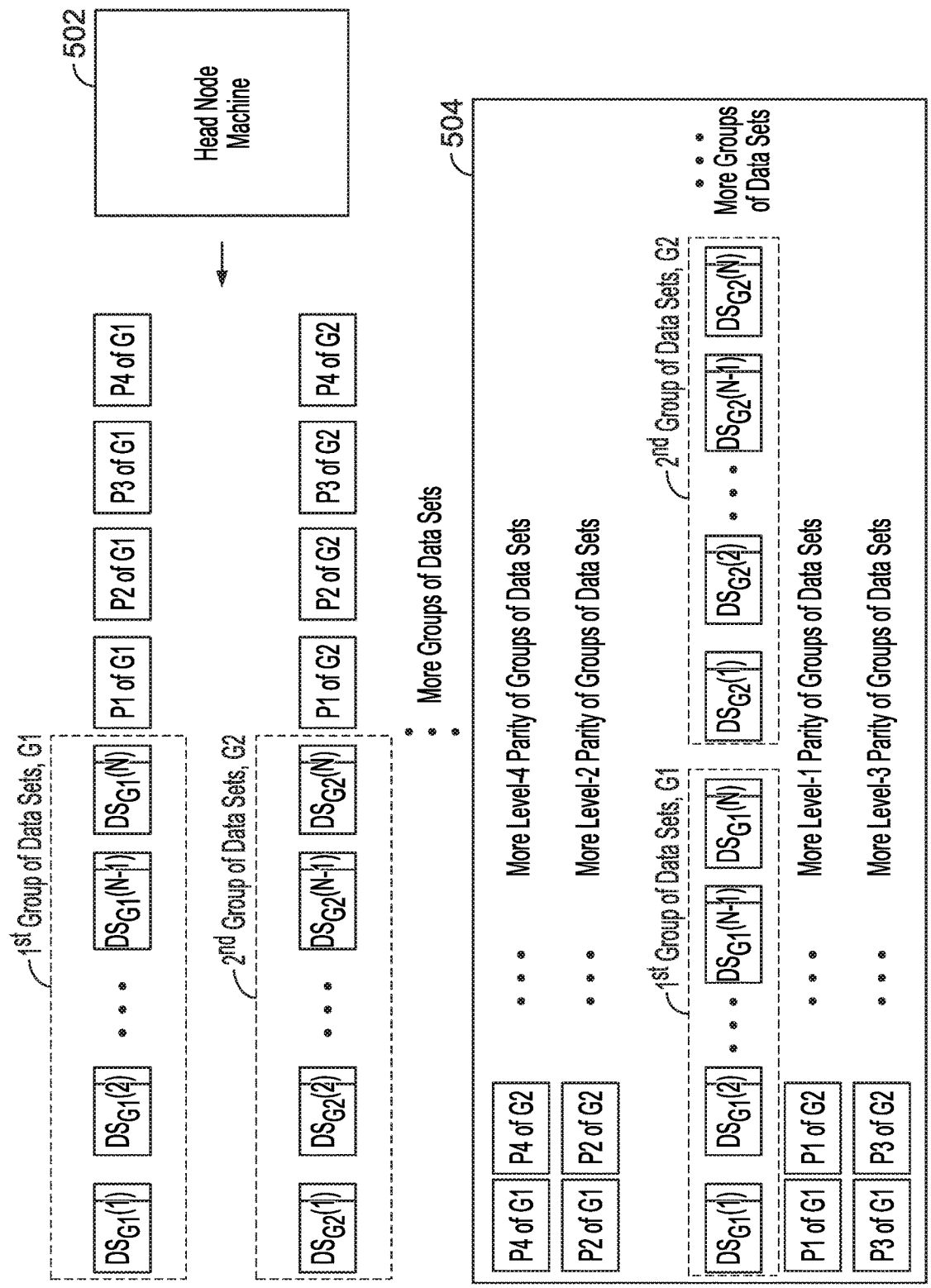
FIG. 5 illustrates one example of how the data sets and the ECC information are written to the tape media using process 400.

FIG. 4 illustrates an exemplary flow diagram of a process 400 for providing C3 ECC parity bytes (an additional $3^{rd}$ layer) of error-correcting code to a tape media. FIG. 5 illustrates one example of how the data sets and the ECC information are written to the tape media using process 400.

Process 400 includes an additional layer of ECC (a $3^{rd}$ layer) to protect the data sets included within a data set group. The error-correcting layer is adaptive to the quality of the tape media. In particular, a maximum of N versions of parities (e.g., P1, P2, P3, and P4) are calculated for each data set group, but the number of versions of parities that are applied depends on how many wraps are left unused after all the data set groups have been written to the tape media. When the tape media quality is good, the spare edge wraps are not used for writing user data and therefore all the spare edge wraps may be used to store the maximum number of N versions of parities for the additional layer of ECC. When the tape media quality is poor, some of the spare edge wraps are used for writing user data and therefore only the remaining unused edge wraps are used to store n of the N versions of parities (where n<N). In this manner, the spare edge wraps are adaptively utilized to store different number of levels/versions of parities depending on the number of remaining wraps at the edges. Additional corrupted data may be recovered even if only a portion of the calculated N versions of parities are eventually stored on the edge wraps. The user data sets are written first to the center wraps (or non-edge wraps) that are more reliable before they are written to the edge wraps. This ensures that even if none of the N versions of parities are applied in some cases, the tape media still maintains the same level of quality as before. But in most cases, at least some of the N versions of parities may be written to the edge wraps to improve tape media reliability, thereby improving the overall system reliability and extending the lifetime of the tape library.

Referring to FIG. 4 and FIG. 5, at step 402, data set groups are determined. Each data set group includes a plurality of data sets. For example, a data set group includes N number of data sets, such as 164 data sets. As shown in FIG. 5, the head node machine 502 generates a first group of data sets, G1, which includes N data sets: $DS_{G1}(1)$, $DS_{G1}(2)$, ... $DS_{G1}(N)$. The head node machine 502 then generates a second group of data sets, G2, which includes another N data sets: $DS_{G2}(1)$, $DS_{G2}(2)$, ... $DS_{G2}(N)$. The head node machine 502 continues to generate a total of M data set groups, G1, G2, G3, ... and GM. Each data set includes error-correcting information for content user data of the data set. In some embodiments, a data set has x MB content user data as an atomic unit, and the x MB data is protected by a 2D-product code by adding C1 parity bytes (a first layer of error-correcting code (ECC)) and C2 parity bytes (a second layer of ECC) to form a (x+y) MB total data set. For example, a 6.2 MB data set has 5 MB user data and 1.2 MB of C1 and C2 parity data.

At step 404, one or more versions of data set group level error-correcting information for each data set group are calculated by one or more head node machines 502. These C3 parity bytes include data set group level error-correcting information that corrects the errors within the data sets in a data set group. In some embodiments, the one or more versions of data set group level error-correcting code include P1, P2, P3, and P4. For example, as shown in FIG. 5, the four versions of error-correcting code that can recover errors of the data sets in group 1 (G1) include P1 of G1, P2 of G1, P3 of G1, and P4 of G1, and the four versions of error-correcting code that can recover errors of the data sets in group 2 (G2) include P1 of G2, P2 of G2, P3 of G2, and P4 of G2, and so on. In some embodiments, each of P1, P2, P3, and p4 is a function of the data sets in a group, such as a linear weighted function over a Galois field.

In one example, P1, P2, P3, and P4 of G1 are as follows:

$$P1=DS_{G1}(1)+DS_{G1}(2)+DS_{G1}(3)+\ldots +DS_{G1}(164)$$

$$P2=x_1*DS_{G1}(1)+x_2*DS_{G1}(2)+x_3*DS_{G1}(3)+\ldots +x_{164}*DS_{G1}(164)$$

$$P3=y_1*DS_{G1}(1)+y_2*DS_{G1}(2)+y_3*DS_{G1}(3)+\ldots +y_{164}*DS_{G1}(164)$$

$$P4=z_1*DS_{G1}(1)+z_2*DS_{G1}(2)+z_3*DS_{G1}(3)+\ldots +z_{164}*DS_{G1}(164)$$

where

P1 is the XOR (Exclusive OR) of all the data sets in group 1;

P2, P3, and P4 are each a linear combination of all the data sets in group 1 over a Galois field with different coefficients for each user data set;

x1, x2, and x3 are coefficients over a Galois field, and the "*" and "+" are calculations over the Galois Field.

In some embodiments, all the versions of parities (P1 to P4) of the data set groups (e.g., a total of 164 data set groups) may be buffered in one or more hard disk drives (HDD) in the one or more head node machines 502. In some embodiments, the total amount of data set group level error-correcting information for all the data set groups is 4*9 TB/168=216 GB of parity data.

At step 406, the data set groups are written and stored on a tape storage media 504. In some embodiments, head node machine 502 may send instructions to a tape drive to write the data set groups onto the tape storage media 504. The data set groups are sequentially written to the center wrap first and then to wraps that are increasingly further out from the center and towards the edges of the tape storage media 504. For each data set group, the data sets in the data set group are sequentially written to a wrap. The first data set group (G1) is written to the center wrap first, and the second data set group (G2) is written to the center wrap next, and so on. When the center wrap is filled, the adjacent wraps further out from the center are filled, and so on, until all the data set groups are written to the tape storage media 504.

For example, as shown in FIG. 5, the first data set group, G1, which includes N data sets: $DS_{G1}(1)$, $DS_{G1}(2)$, . . . $DS_{G1}(N)$, are written to the center wrap first. Next, the second data set group, G2, which includes $DS_{G2}(1)$, $DS_{G2}(2)$, . . . $DS_{G2}(N)$, are written to the center wrap. More data set groups are written to the center wrap until it is filled. Then the two adjacent wraps further out from the center are filled next, and the writing to wraps that are increasingly further out from the center and towards the edges of the tape storage media 504 is repeated until all the data set groups (which includes a total of 9 TB of user data) are written to the tape storage media 504.

At step 408, any storage that is available on one or more regions of the tape storage media 504 associated with one or more tape edges of the tape storage media 504 is identified. In some embodiments, step 408 is performed by head node machine 502. As discussed earlier, when the tape media quality is good, the spare edge wraps are storage that are not used for writing user data and therefore all the spare edge wraps, associated with both of the tape edges, are storage available on regions of the tape storage media 504 for storing the maximum number of versions of N parities for the additional layer of ECC. Two spare wraps are available at each tape edge of the tape storage media 504 for storage. However, when the tape media quality is poor, some of the spare edge wraps may have already been used for writing user data and therefore only the remaining unused edge wraps are available to store n of the N versions of parities (where n<N). For example, if three of the spare edge wraps have already been used for writing user data, then only the remaining fourth spare edge wrap is identified as available storage. For example, if three of the spare edge wraps and a portion or region of the fourth spare edge wrap have already been used for writing user data, then only the remaining regions of the fourth spare edge wrap are identified as available storage.

At step 410, at least some of the calculated versions of data set group level error-correcting information for the data set groups are stored in the available storage. In some embodiments, head node machine 502 may send instructions to the tape drive to write the error-correcting information onto the tape storage media 504. When the tape media quality is especially poor, all the spare edge wraps are completely used for writing user data, and therefore no available storage is identified. As a result, all the buffered parity data will be discarded. Typically, however, there are at least some spare edge wraps that are unused depending on the actual quality of the tape storage media 504, and therefore at least some of the calculated versions of data set group level error-correcting information for the data set groups may be stored therein.

Figure 6:
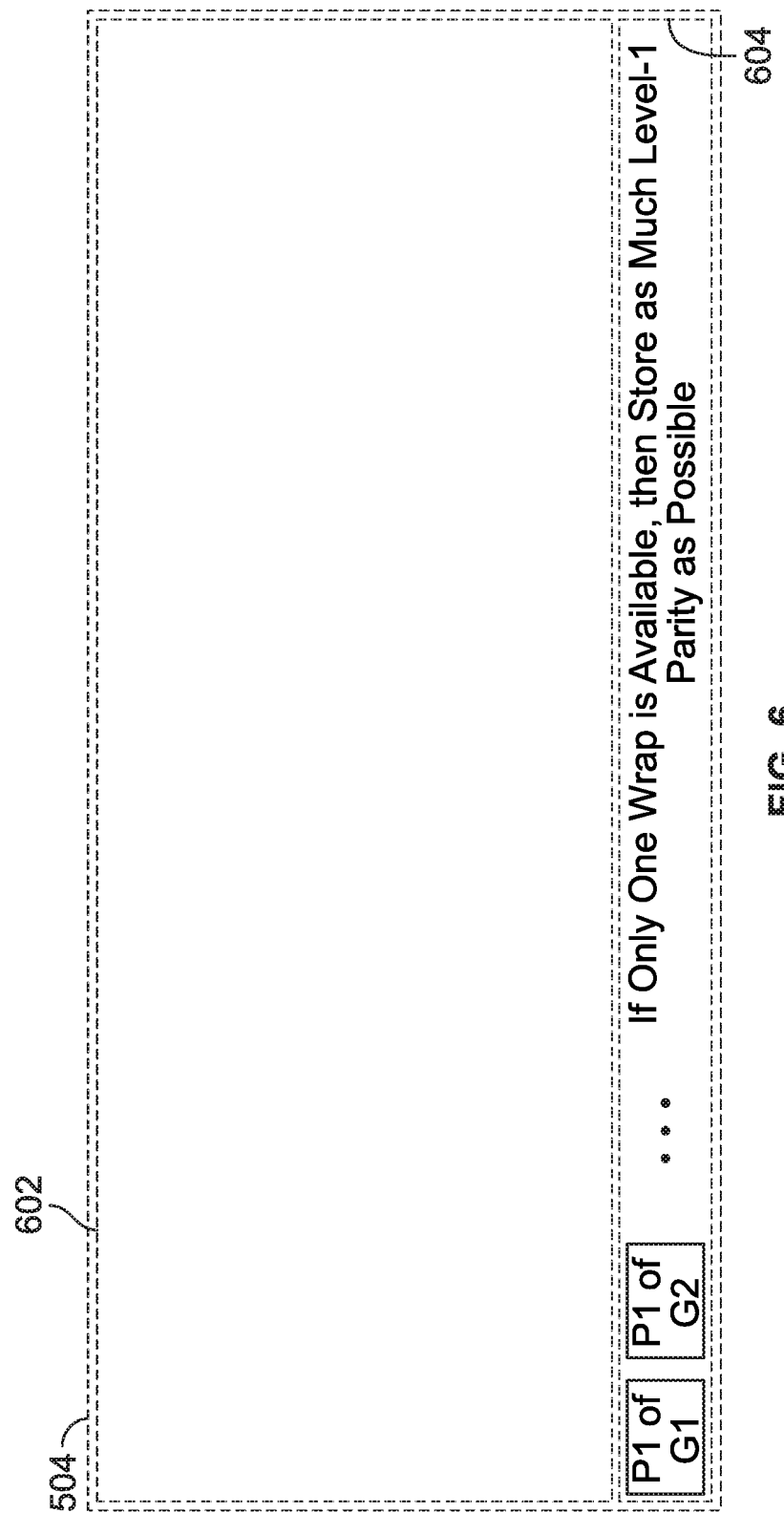
FIG. 6 illustrates that only version-1 parity data can be written when there is only one or less than one unused wraps.

FIG. 6 illustrates that only version-1 parity data can be written when there is only one or less than one unused wraps. As shown in FIG. 6, if there is only one or less than one unused wrap 604 and the rest of the wraps are used wraps 602, then as much of the version-1 parity data is written to the unused wrap 604, and the version-2, version-3, and version-4 parity data is discarded. Note that for every 164 data sets in a data set group, there is one P1 parity data set (5+1.2=6.2 MB). Note that the 5 MB user data and the 1.2 MB error correction parity data in a data set is just an example. The actual byte sizes for the user data and the error correction parity data may be different over different tape generations.

Figure 7:
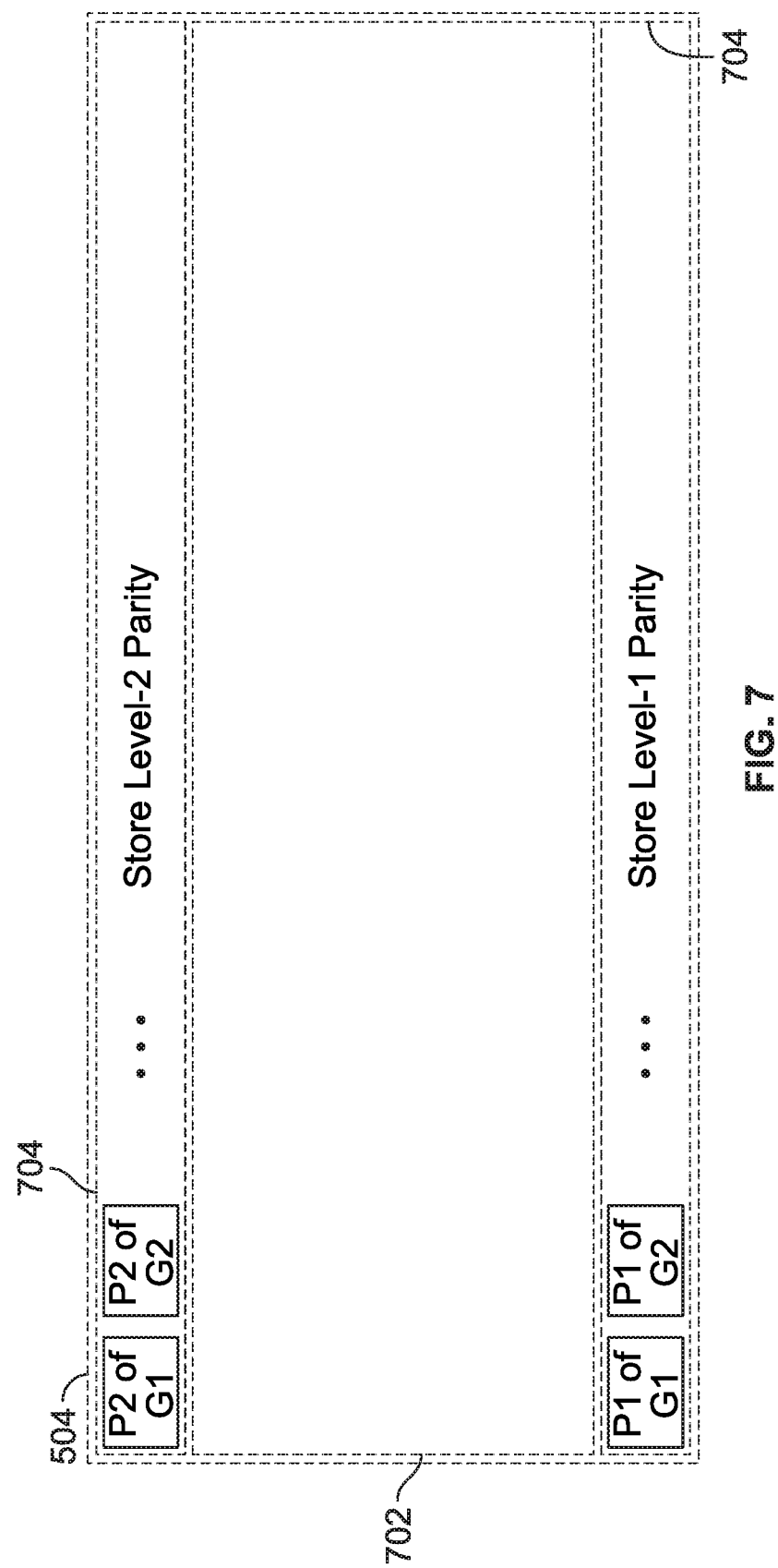
FIG. 7 illustrates that only version-1 and version-2 parity data can be written when there are only two or between one and two unused wraps.

FIG. 7 illustrates that only version-1 and version-2 parity data can be written when there are only two or between one and two unused wraps. As shown in FIG. 7, if there are two unused wraps 704 or between one and two unused wraps 704, and the rest of the wraps are used wraps 702, then as much of the version-1 parity data and version-2 parity data is written to the unused wraps 704, and the remaining parity data is discarded.

Figure 8:
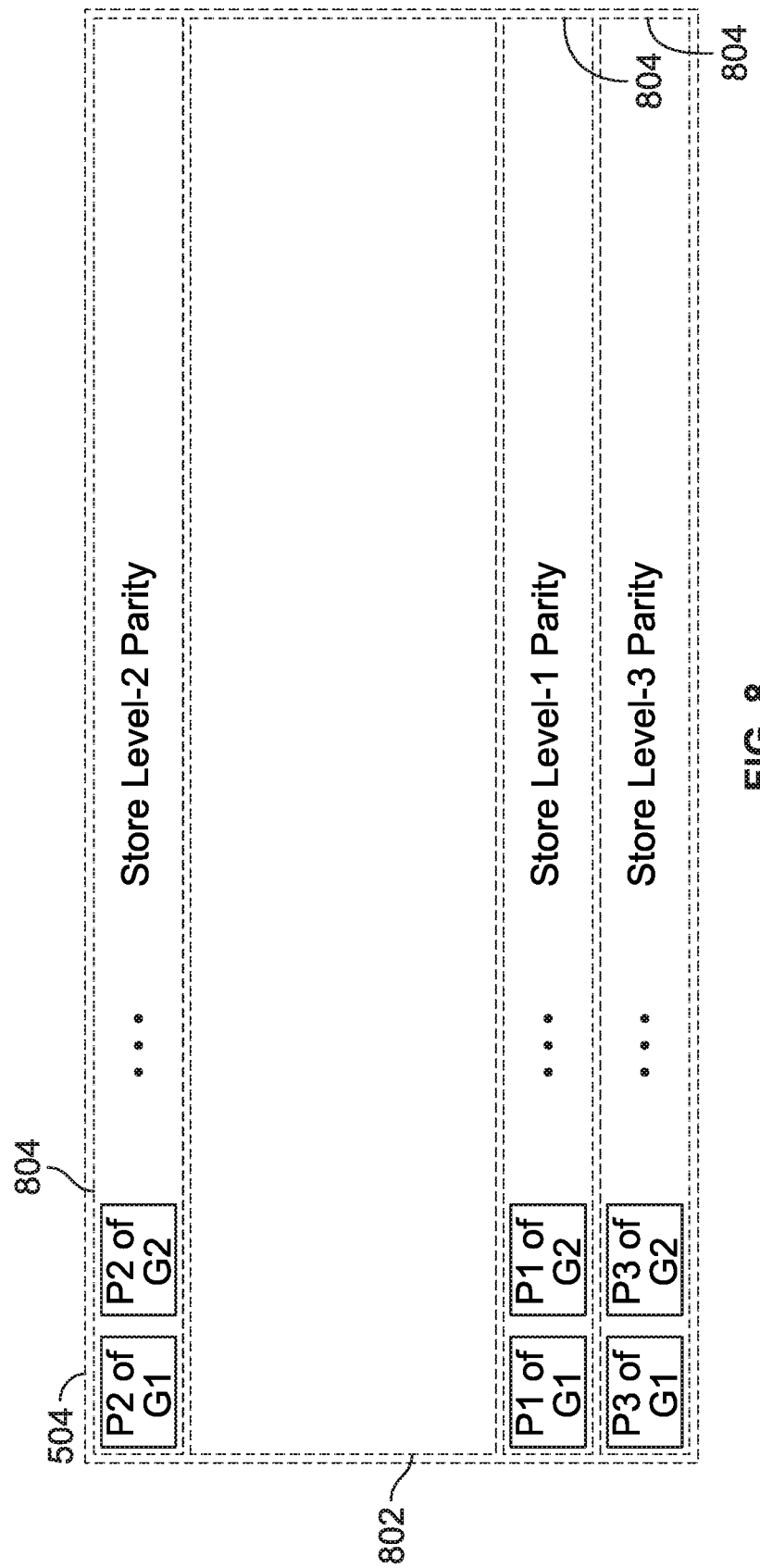
FIG. 8 illustrates that only version-1, version-2, and version-3 parity data can be written when there are only three or between two and three unused wraps.

FIG. 8 illustrates that only version-1, version-2, and version-3 parity data can be written when there are only three or between two and three unused wraps. As shown in FIG. 8, if there are three unused wraps 804 or between two and three unused wraps 804, and the rest of the wraps are used wraps 802, then as much of the version-1, version-2, and version-3 parity data as space permits is written to the unused wraps 804, and any remaining parity data is discarded.

Figure 9:
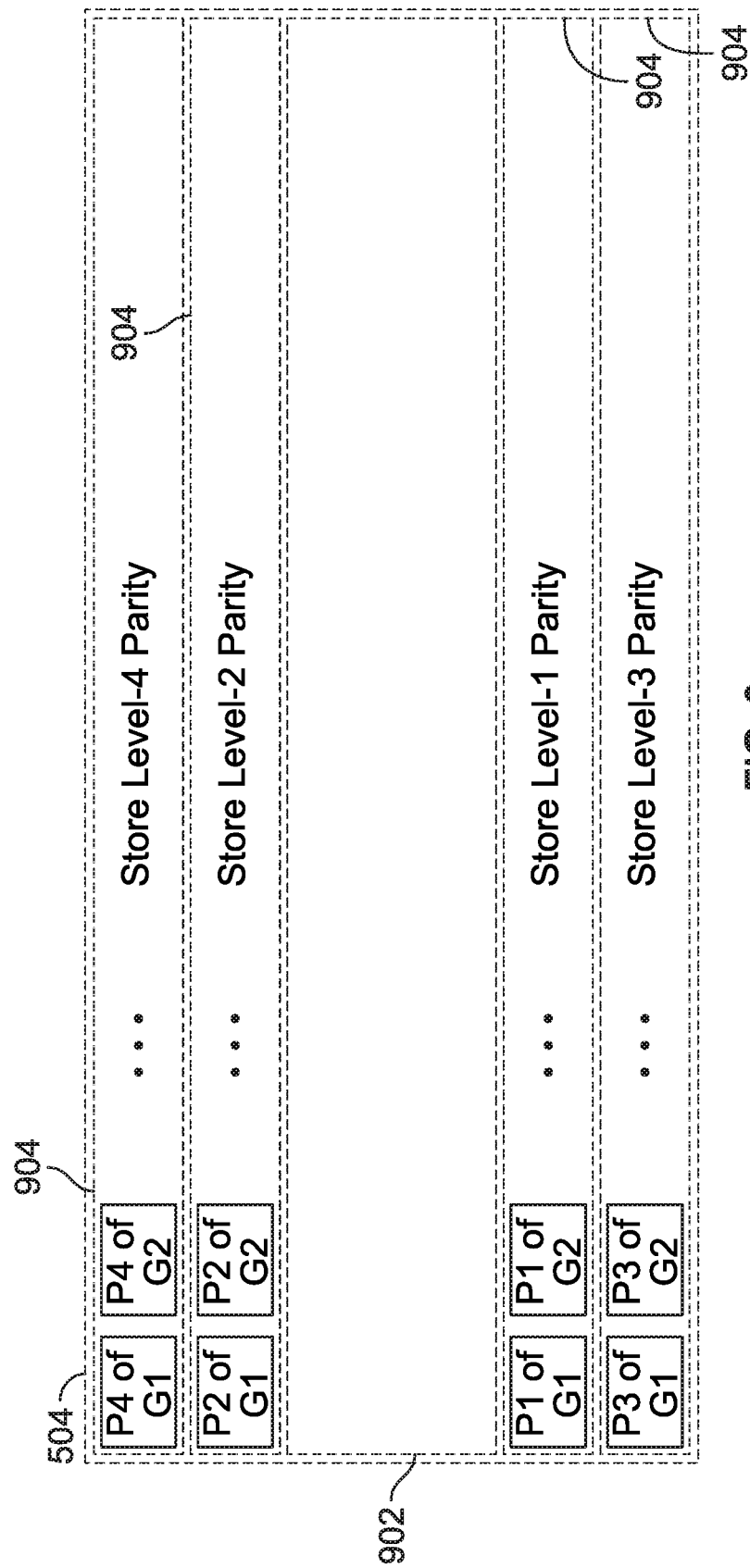
FIG. 9 illustrates that all four levels of parity data can be written when there are four or between three and four unused wraps.

FIG. 9 illustrates that all four levels of parity data can be written when there are four or between three and four unused wraps. As shown in FIG. 9, if there are four unused wraps 904 or between three and four unused wraps 904, and the rest of the wraps are used wraps 902, then as much of the version-1, version-2, version-3, and version-4 parity data as space permits is written to the unused wraps 904.

As shown in step 410, a $3^{rd}$ layer of ECC protection calculated by a host is co-located with user data on the tape storage media 504. The C3 ECC is an adaptive protection in accordance with the available space on the tape storage media 504. The spare edge wraps are adaptively utilized to store different number of versions of parities depending on the number of remaining wraps at the edge. The C3 decoding scheme can decode uncorrectable data even when partial versions of parities are stored on the edge wraps, thereby improving the overall system reliability and extending the lifetime of the tape library.

Figure 10:
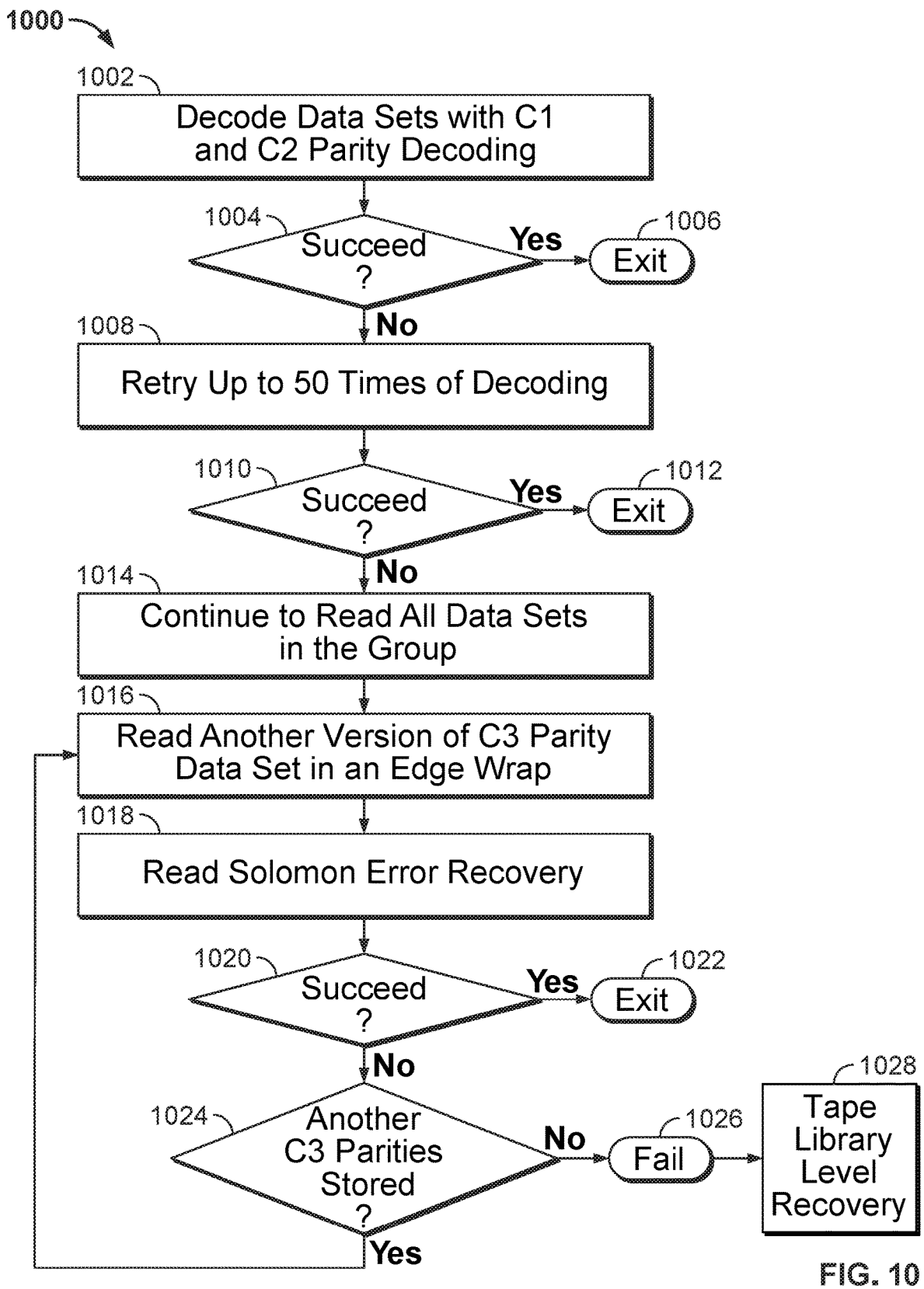
FIG. 10 illustrates an example of a process 1000 for reading data from a tape storage media and recovering the errors of the read data using three layers of ECC protection.
Figure 11:
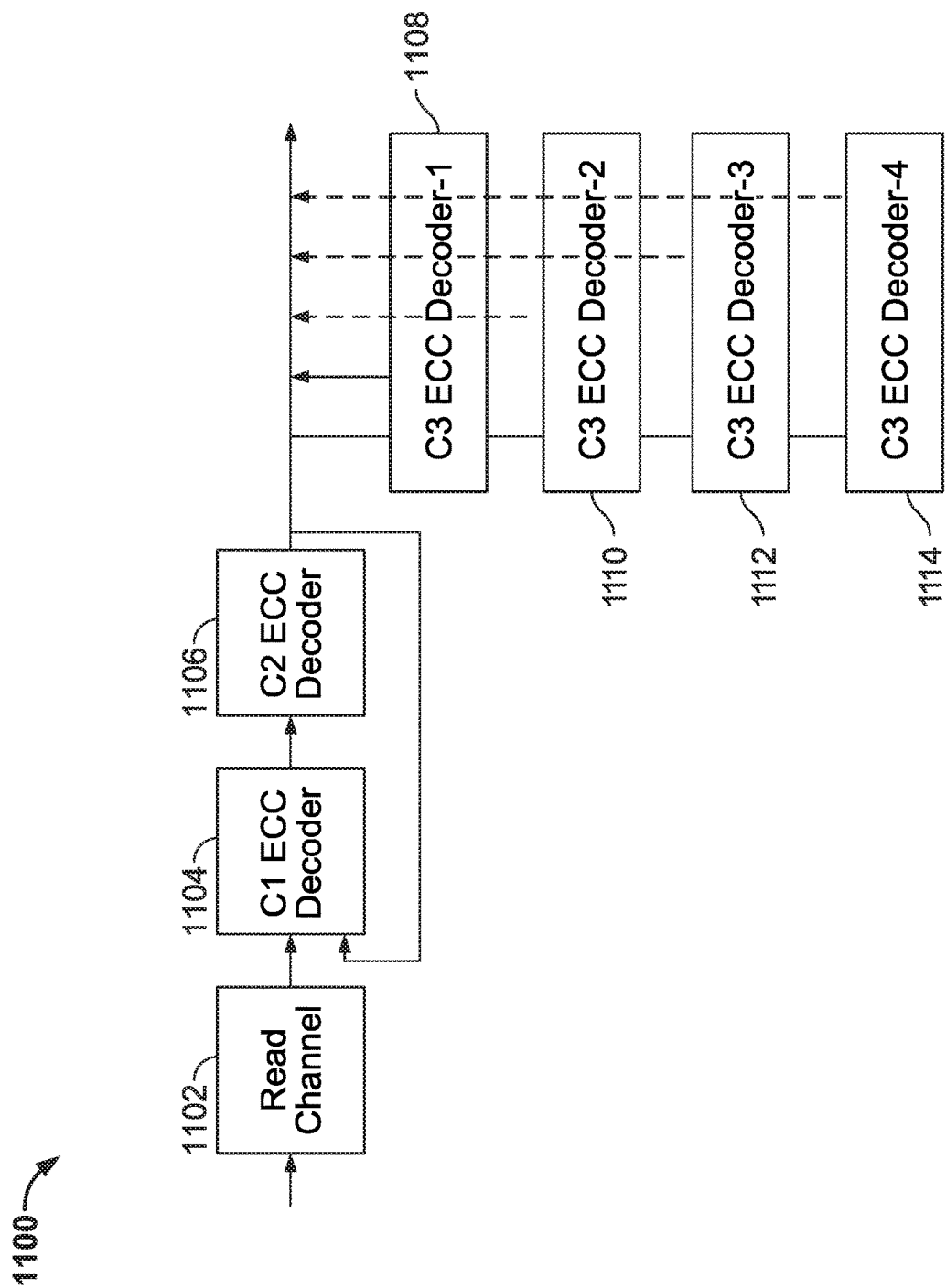
FIG. 11 illustrates an example of a system 1100 for reading data from a tape storage media and recovering the errors of the read data using the three layers of ECC protection.

FIG. 10 illustrates an example of a process 1000 for reading data from a tape storage media and recovering the errors of the read data using three layers of ECC protection. FIG. 11 illustrates an example of a system 1100 for reading data from a tape storage media and recovering the errors of the read data using the three layers of ECC protection. In some embodiments, system 1100 may be used to perform process 1000. System 1100 includes a read channel 1102, a C1 ECC decoder 1104, a C2 ECC decoder 1106, a C3 ECC decoder-1, a C3 ECC decoder-2, a C3 ECC decoder-3, and a C3 ECC decoder-4.

At step 1002, data sets in a data set group are read from the tape storage media by read channel 1102 and decoded by C1 ECC decoder 1104 and C2 ECC decoder 1106 using C1 and C2 parity decoding, respectively. Each data set is protected by C1 parity bytes (a first layer of error-correcting code (ECC)) and C2 parity bytes (a second layer of ECC). When there is an error reading a data set, the C1 and C2 parity bytes corresponding to the data set are used to correct the error. At 1004, if the error is successfully recovered, then the decoding of the data sets in the group continues and the process exits at 1006. If the error is not successfully recovered using the C1 and C2 parity bytes corresponding to the data set, then at 1008, the error recovery using the C1 and C2 parity bytes is repeated for a predetermined number of times, e.g., fifty times. At 1010, if the error is successfully recovered after less than the predetermined number of maximum retries, then the decoding of the data set in the group continues and the process exits at 1012. If the error is not successfully recovered using the C1 and C2 parity bytes corresponding to the data set after the predetermined number of maximum retries, then at 1014, process 1000 stops to try to decode the data set with the error with the C1 and C2 parity bytes and continues to read the remaining data sets in the group. At 1016, a version of C3 parity data that is stored in a spare edge wrap is read. At 1018, the version of C3 parity data is used to correct the error(s) in any of the data sets in the data set group. At 1020, if the error(s) are successfully recovered using the current version of C3 parity data (e.g., P1), then the process exits at 1022. If the error(s) are not successfully recovered using the current version of C3 parity data, then at 1024, it is determined whether there is another version of C3 parity data that has been stored in a spare edge wrap. If there is another version of C3 parity data available, then the process proceeds to step 1016 and another version of C3 parity data is read. If there is no additional version(s) of C3 parity data available, at 1026, it is determined that the process failed to correct the error(s) in the data set group using the C3 decoding scheme. After step 1026, at step 1028, another error recovery scheme across different tape libraries may be used to rebuild the data. For example, the error recovery scheme may be a Reed-Solomon RAID (redundant array of independent disks) code, such as a (5:7) RS-RAID code.

As shown in process 1000, if there is a data set read failure using the C1 and C1 parity bytes, there is a data set loss and the reading of that data set is stopped and the remaining data sets in the data set group are read in a sequential manner. In other words, an unreadable data set is skipped and the reading process continues to the next data set. For example, suppose that a 5 MB data set cannot be correctly read after fifty read retries using the 2D-product decoding. There is then a 5 MB data set loss. After the data set loss, the remaining data sets in the data set group, e.g., the rest of the 164 data sets in the data set group, are read in a sequential manner. After all the data sets in the data set group (e.g., G1) have been read, the first version of C3 parity data (i.e., P1 of G1) is then read and a first level of RAID recovery using the data sets $DS_{G1}(1)$, $DS_{G1}(2)$, ... $DS_{G1}(N)$, and P1 is performed by the C3 ECC decoder-1 1108. If P1 cannot correct the error, the second version of C3 parity data (i.e., P2 of G1) is read if the P2 parity data is available, and a second level of RAID recovery is performed by the C3 ECC decoder-2 1110. If P2 still cannot correct the error, the third version of C3 parity data (i.e., P3 of G1) is read if the P3 parity data is available, and a third level of RAID recovery is performed by the C3 ECC decoder-3 1112. If P3 still cannot correct the error, the fourth version of C3 parity data (i.e., P4 of G1) is read if the P4 parity data is available, and a fourth level of RAID recovery is performed by the C3 ECC decoder-4 1114.

If only one version of C3 parity data is stored in the tape storage media, then this version of C3 parity data can correct one 5 MB data set loss in a data set group with 164 data sets. If two versions of C3 parity data are stored, then up to two 5 MB data set losses in a data set group may be corrected. If three versions of C3 parity data are stored, then up to three 5 MB data set losses in a data set group may be corrected. If four versions of C3 parity data are stored, then up to four 5 MB data set losses in a data set group may be corrected.

There are many benefits of adding the $3^{rd}$ layer of ECC protection. The single tape media failure rate is reduced such that the triggering rate of a cross tape media RAID recovery (e.g., a (5:7) RS-RAID code.) is reduced. Alternatively, less RAID protection may be applied. For example, instead of applying a (5:7) RS-RAID code that has a 40% cost overhead, a lower RS-RAID code such as a (10:12) RS-RAID code that has 20% less overhead may be used to save cost but still provide the same reliability level. The per tape cartridge reliability is improved such that the error recovery latency can be significantly reduced for most cases. In addition, this technique uses the free unused wraps to implement the additional ECC protection. Because four free wraps are exploited for every 164 wraps, the technique gains 2.5% free tape storage across all data centers, thereby reducing the storage cost significantly.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
   determining data set groups, wherein each data set group includes a plurality of data sets and each data set includes error-correcting information for content user data of the data set;

calculating one or more versions of data set group level error-correcting information for each data set group of the data set groups;

providing an instruction to store the data set groups on a tape storage media;

after the data set groups are stored on the tape storage media, identifying an amount of storage available on one or more regions of the tape storage media associated with one or more tape edges; and providing an instruction to store at least a partial amount of the calculated one or more versions of data set group level error-correcting information for the data set groups able to be stored in the amount of storage available on the one or more regions of the tape storage media associated with the one or more tape edges.

2. The method of claim 1, wherein the error-correcting information included in each data set comprises data set level error-correcting information that corrects at least one or more errors within the data set.

3. The method of claim 1, wherein the one or more versions of data set group level error-correcting information for each data set group each comprises error-correcting information that corrects at least one or more errors within the data sets in the data set group.

4. The method of claim 1, wherein the one or more versions of data set group level error-correcting information for each data set group each comprises a function of the data sets in the data set group.

5. The method of claim 1, wherein the one or more versions of data set group level error-correcting information for each data set group each comprises a linear weighted function over a Galois field.

6. The method of claim 1, wherein the one or more versions of data set group level error-correcting information for each data set group each comprises a linear combination of all the data sets in the data set group over a Galois field with different coefficients for each data set.

7. The method of claim 1, wherein storing the data set groups on the tape storage media comprises storing the data set groups sequentially to a center wrap first and then storing the data set groups to a plurality of wraps that are increasingly further out from the center wrap and towards the tape edges of the tape storage media until all of the data set groups are stored on the tape storage media.

8. The method of claim 1, wherein storing the data set groups on the tape storage media comprises storing the data set groups sequentially to a center wrap first, and when the center wrap is filled, storing the next data set groups to two wraps adjacent to the center wrap.

9. The method of claim 1, wherein identifying the amount of storage available on the one or more regions of the tape storage media associated with the one or more tape edges comprises identifying up to N unused wraps associated with one or two tape edges, wherein N is a predetermined number.

10. The method of claim 9, further comprising in response to a determination that one or less than one unused wrap is identified, storing as much of a first version of data set group level error-correcting information for the data set groups and discarding remaining versions of data set group level error-correcting information for the data set groups.

11. The method of claim 9, further comprising in response to a determination that two or between one and two unused wraps are identified, storing as much of a first version and a second version of data set group level error-correcting information for the data set groups and discarding remaining versions of data set group level error-correcting information for the data set groups.

12. The method of claim 9, further comprising in response to a determination that three or between two and three unused wraps are identified, storing as much of a first version, a second version, and a third version of data set group level error-correcting information for the data set groups and discarding remaining versions of data set group level error-correcting information for the data set groups.

13. The method of claim 9, further comprising in response to a determination that four or between three and four unused wraps are identified, storing as much of a first version, a second version, a third version, and a fourth version of data set group level error-correcting information for the data set groups and discarding remaining versions of data set group level error-correcting information for the data set groups.

14. The method of claim 1, wherein one of the data sets in one of the data set groups is read from the tape storage media, and in response to a determination that there is one or more errors in the one of the data sets, the one or more errors in the one of the data sets are corrected by a decoder using the error-correcting information included in the data set.

15. The method of claim 1, wherein one of the data sets in one of the data set groups is read from the tape storage media, and in response to a determination that there is one or more errors in the one of the data sets and that not all of the one or more errors in the one of the data sets are corrected by a decoder using the error-correcting information included in the data set after a predetermined number of retries, the remaining data sets in the one of the data set groups are read from the tape storage media, and wherein the at least a partial amount of the calculated one or more versions of data set group level error-correcting information for the data set groups is used to correct the one or more errors in the one of the data sets.

16. A system, comprising:
a processor; and
a memory coupled with the processor, wherein the memory is configured to provide the processor with instructions which when executed cause the processor to:
determine data set groups, wherein each data set group includes a plurality of data sets and each data set includes error-correcting information for content user data of the data set;
calculate one or more versions of data set group level error-correcting information for each data set group of the data set groups;
provide an instruction to store the data set groups on a tape storage media;
after the data set groups are stored on the tape storage media, identify an amount of storage available on one or more regions of the tape storage media associated with one or more tape edges; and
provide an instruction to store at least a partial amount of the calculated one or more versions of data set group level error-correcting information for the data set groups able to be stored in the amount of storage available on the one or more regions of the tape storage media associated with the one or more tape edges.

17. The system of claim 16, wherein the one or more versions of data set group level error-correcting information for each data set group each comprises error-correcting information that corrects one or more errors within the data sets in the data set group.

18. The system of claim 16, wherein the memory is configured to provide the processor with instructions which when executed cause the processor to identify the amount of storage available on the one or more regions of the tape storage media associated with the one or more tape edges including being configured to provide the processor with instructions which when executed cause the processor to identify up to N unused wraps associated with one or two tape edges, wherein N is a predetermined number.

19. The system of claim 18, wherein the memory is configured to provide the processor with instructions which when executed cause the processor to determine that one or less than one unused wrap is identified, and store as much of a first version of data set group level error-correcting information for the data set groups and discard remaining versions of data set group level error-correcting information for the data set groups.

20. A computer program product, the computer program product being embodied in a tangible computer readable storage medium and comprising computer instructions for:

determining data set groups, wherein each data set group includes a plurality of data sets and each data set includes error-correcting information for content user data of the data set;

calculating one or more versions of data set group level error-correcting information for each data set group of the data set groups;

providing an instruction to store the data set groups on a tape storage media;

after the data set groups are stored on the tape storage media, identifying an amount of storage available on one or more regions of the tape storage media associated with one or more tape edges; and providing an instruction to store at least a partial amount of the calculated one or more versions of data set group level error-correcting information for the data set groups able to be stored in the amount of storage available on the one or more regions of the tape storage media associated with the one or more tape edges.

* * * * *